(12) United States Patent
Rowell

(10) Patent No.: US 11,933,829 B2
(45) Date of Patent: Mar. 19, 2024

(54) TEST SYSTEM

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 173 days.

(21) Appl. No.: 17/715,581

(22) Filed: Apr. 7, 2022

(65) Prior Publication Data

US 2022/0373585 A1 Nov. 24, 2022

(30) Foreign Application Priority Data

May 21, 2021 (EP) ..................... 21175320

(51) Int. Cl.
*G01R 29/10* (2006.01)
*G01R 29/08* (2006.01)

(52) U.S. Cl.
CPC ....... *G01R 29/105* (2013.01); *G01R 29/0821* (2013.01)

(58) Field of Classification Search
None
See application file for complete search history.

(56) References Cited

U.S. PATENT DOCUMENTS

| 4,521,780 A | 6/1985 | Preikschat |
| 11,815,539 B2* | 11/2023 | Sanchez Hernandez ..................... G01R 29/105 |
| 2009/0115440 A1 | 5/2009 | Bergmann |
| 2015/0226777 A1* | 8/2015 | Qian ....................... G01R 29/10 343/703 |
| 2019/0215085 A1 | 7/2019 | Rowell et al. |
| 2020/0217885 A1 | 7/2020 | Rowell |
| 2020/0264223 A1* | 8/2020 | Pabst ................ G01R 29/0821 |
| 2021/0341572 A1* | 11/2021 | Hamberger ........... G01S 7/4052 |
| 2022/0236310 A1* | 7/2022 | Rowell ................. G01R 29/08 |
| 2022/0303029 A1* | 9/2022 | Liu ........................ H01Q 15/18 |

FOREIGN PATENT DOCUMENTS

WO 8606550 A1 11/1986

* cited by examiner

*Primary Examiner* — Wilson Lee

(74) *Attorney, Agent, or Firm* — CHRISTENSEN O'CONNOR JOHNSON KINDNESS PLLC

(57) ABSTRACT

A test system for testing a device under test is provided including at least one feed antenna, a shielded chamber, and at least a first reflector and a second reflector. The test system is a compact antenna test range. The first reflector and the second reflector are arranged inside the shielded chamber. The first reflector is configured and arranged such that it redirects outgoing test signals emitted by the at least one feed antenna towards the second reflector and incoming test signals coming from the second reflector towards the at least one feed antenna. The device under test is arranged outside the shielded chamber. The shielded chamber includes at least a first interface associated with the device under test. The first interface and the feed antenna are located at different sides of the shielded chamber, which are perpendicular to each other.

15 Claims, 1 Drawing Sheet

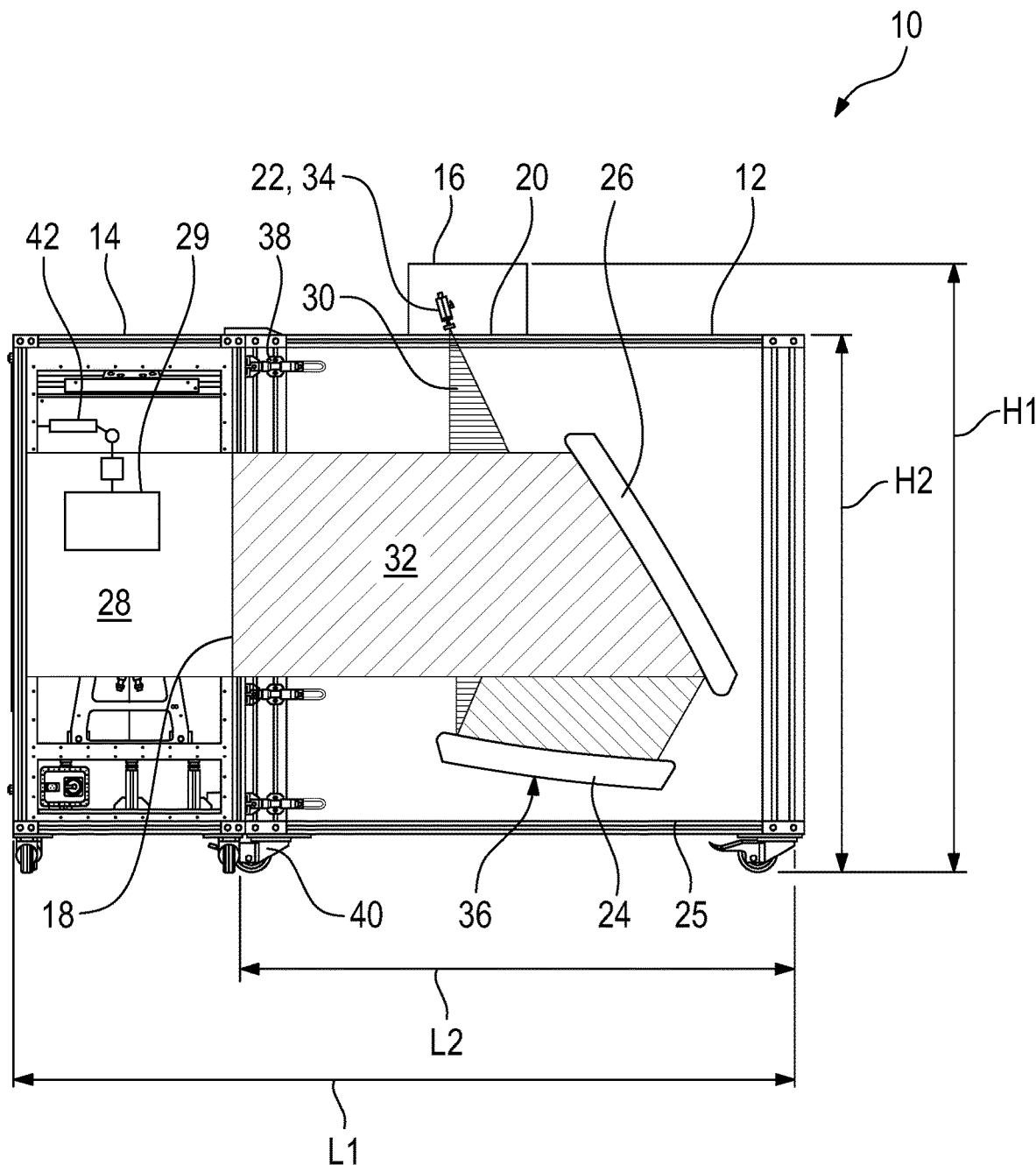

TEST SYSTEM

FIELD OF THE DISCLOSURE

The present disclosure generally relates to examples of a test system for testing a device under test, for example a compact antenna test range.

BACKGROUND

In known compact antenna test range (CATR) systems for investigating the far-field characteristics of a device under test (DUT) over-the-air (OTA) with regard to its electromagnetic properties, the DUT and at least one feed antenna are arranged inside a shielded chamber such that a far-field configuration is obtained despite the limited space.

In order to focus the electromagnetic waves emitted and received by the feed antenna at least one reflector is typically used.

The feed antenna, the reflector, and the DUT are usually arranged within a single horizontal plane. Due to physical requirements regarding the focusing mechanism in view of the signal path, the reflector has to be arranged at a minimum distance from the feed antenna. Therefore, the chambers have comparably large dimensions, particularly widths.

In order to obtain far-field characteristics at limited space, more than one reflector, e.g. two reflectors, may be used such that the electromagnetic waves are reflected twice between the feed antenna and the device under test.

However, the above-mentioned disadvantage concerning the focusing mechanism is further strengthened for these two reflector systems, since the relative positions of the reflectors cause additional size constraints leading to larger setups. As a consequence, installation and transportation of these chambers may require special facilities, since at least in some cases the shielded chambers may be too large to fit spatial bottlenecks, such as door openings or elevators.

SUMMARY

A summary of certain embodiments disclosed herein is set forth below. It should be understood that these aspects are presented merely to provide a brief summary of these certain embodiments and that these aspects are not intended to limit the scope of this disclosure. This disclosure may encompass a variety of aspects that may not be set forth below.

According to an aspect of the present disclosure, a test system for testing a device under test (DUT) is provided. In an embodiment, the test system comprises at least one feed antenna, a shielded chamber, and at least a first reflector and a second reflector. The test system is, for example, a compact antenna test range. The first reflector and the second reflector are arranged inside the shielded chamber. The first reflector is configured and arranged such that it redirects outgoing test signals emitted by the at least one feed antenna towards the second reflector and incoming test signals coming from the second reflector towards the at least one feed antenna. The DUT is arranged outside the shielded chamber. The shielded chamber comprises, for example, at least a first interface associated with the DUT. The first interface and the feed antenna are located at different sides of the shielded chamber, which are perpendicular to each other.

Since the interface and the feed antenna are arranged perpendicular to each other, the spatial dimensions of the system, for example the ones of the shielded chamber, may be reduced compared to existing systems, for example those systems where the components are arranged in a single horizontal plane within a single large chamber. Accordingly, the test system is advantageously designed fitting narrower constrictions when being transported or installed while providing a far-field configuration enabling to test the DUT under far-field conditions.

In some embodiments, the shielded chamber comprises the bottom (side), lateral sides, and the top (side) which together encompass an interior space (volume). The respective sides are limited by walls. At least one of the walls limiting the interior space or volume may have an opening, for example an interface.

The DUT may be arranged in a separately formed test chamber, e.g. another shielded chamber, that is adjacently arranged to the shielded chamber that encompasses the reflectors. In some embodiments, the test chamber may be adjacently arranged to the shielded chamber when the test system is in use.

The feed antenna and the reflectors may be configured to provide a quiet zone at a test location such that the DUT can be arranged within the quiet zone. In some embodiments, the test location including the quiet zone may be established within the test chamber separate of the shielded chamber.

The test chamber may be detachably connected to the shielded chamber. Making use of multiple chambers advantageously enables easy transportation since the dimensions of the shielded chamber and the test chamber may independently fit constrictions. In other words, for easy transportation the test chamber may by detached from the shielded chamber and separately transported. Moreover, this design enables easier maintenance or replacement actions if only part of the test system is damaged or to be serviced.

In some embodiments, the entire test system may comprise more than one chamber, wherein the chambers have interfaces via which they can be detachably connected, thereby establishing a larger common chamber.

For instance, two shielded chambers, each encompassing reflectors, as well as one test chamber are provided, wherein the test chamber has two interfaces at opposite sides via which the shielded chambers can be detachably connected, respectively.

The DUT may be arranged in an at least partly open space adjacent to the shielded chamber. Accordingly, the DUT may be easily placed by a user inside the test chamber since easy access is provided. Also, the shielded chamber and the test chamber may comprise corresponding openings such that components altering the electromagnetic radiation of the signal path may be avoided.

The test system may further comprise a positioner for positioning the DUT. The positioner may provide the possibility to arrange the DUT relative to the shielded chamber in all three perpendicular directions of a Cartesian coordinate system. Thus, the positioner may be a so-called 3D-positioner. The positioner may also be configured to define up to three rotation angles of the DUT relative to the shielded chamber, for example the test location within the test chamber. Hence, the positioner may be located within the test chamber. For example, the positioner may comprise an articulated arm that is used for moving the DUT. Alternatively, the positioner comprises two or more supports that are movable with respect to each other, thereby ensuring the overall movability of the positioner.

Generally, the possibility of detaching the test chamber from the shielded chamber may be provided at the expense of a precise positioning mechanism of the DUT relative to the shielded chamber in case of a misalignment when connecting the chambers. The positioner may serve to overcome this drawback such that the focusing conditions of the signal path in view of the first and/or second reflectors may be fulfilled.

In an alternative embodiment, the test system may comprise an alignment member for aligning the test chamber relative to the shielded chamber appropriately. As an example, the alignment member may comprise components for defining a predetermined (relative) position and/or orientation, such as latches and/or spring locks.

A phase center of the at least one feed antenna may be located on top of the shielded chamber. The phase center may be higher than the center of the first reflector. Hence, the feed antenna and the first reflector may advantageously not be arranged in a horizontal plane, but in a vertical plane. The minimum distance between the first reflector and the feed antenna may rather be established in a vertical direction. Therefore, the dimensions of the shielded chamber may be further reduced, for example the dimensions in a horizontal plane, i.e. length and width.

Alternatively or additionally, the first reflector may be positioned close to a bottom of the shielded chamber or may rest on the bottom of the shielded chamber. This arrangement is also beneficial in terms of the height of the test system. Since there needs to be a minimum distance between the feed antenna and the first reflector, the height of the test system may be reduced as much as possible in view of the perpendicular arrangement of the sides of the first interface and the feed antenna.

In an alternative embodiment, a phase center of the at least one feed antenna may also be located below the shielded chamber. The phase center of the at least one feed antenna may be lower than the center of the first reflector. This arrangement also allows the lateral dimensions of the test system, i.e. the length and width, to be reduced. Again, the feed antenna and the first reflector are arranged in a vertical manner rather than a horizontal one.

As an option, the feed antenna may be located in an antenna chamber adjacently arranged to the shielded chamber. In some embodiments, the antenna chamber may be detachably connected with the shielded chamber via a second interface. The antenna chamber may be established as a separately formed chamber with respect to the shielded chamber. Accordingly, the test chamber may comprise at least three different chambers, namely the shielded chamber, the test chamber, and the antenna chamber. Therefore, the individual components of the test system may be independently transported such that transport may be simplified due to the reduced size(s) of the individual components. Furthermore, since the feed antenna may be located in a separate chamber, the shielded chamber may be designed with reduced dimensions. This may be beneficial with regard to the overall manufacturing costs of the test system since the individual chambers may have a summed volume being smaller than a volume of a respective one-chamber setup.

As an option, the test system may comprise an additional positioning member for positioning the antenna chamber relative to the shielded chamber. The positioning member may comprise coupling components for defining a predetermined (relative) position and/or orientation, such as latches or spring locks.

Alternatively or additionally, the test system may also comprise an antenna positioner for positioning the feed antenna inside the antenna chamber. Accordingly, the feed antenna may be appropriately positioned to fit the conditions of the signal path in view of the first and second reflectors as well as the DUT.

The first interface of the shielded chamber, for example at least one of the first interface and the second interface, may comprise an opening or a window. The interfaces may then advantageously be configured not to influence the electromagnetic radiation of the signal path. Moreover, openings and windows may be cost-effectively realized when producing the test system.

The first reflector may be a sub-reflector having two focal points. Having multiple focal points provides a larger range of positioning the components of the signal path being adjacently arranged to the first reflector, i.e. the second reflector and the feed antenna. In other words, the variability of positioning the components of the test system involved in the signal path may be improved.

Moreover, more than one test frequency can be used for testing the DUT simultaneously.

The first reflector may have a shape of one of a hyperboloid or an ellipsoid. In some embodiments, the shape may be convex or concave. These shapes may advantageously provide multiple focal points such that the variability of the test system is improved.

The second reflector may be a main reflector having a shape of a paraboloid. A paraboloid has only a single focal point which may be sufficient for the second reflector. Accordingly, the focusing properties may be well-defined.

The electromagnetic signal may be reflected by the second reflector so that the electromagnetic signal corresponds to a plane wave, for example at the test location.

Alternatively or additionally, at least one of the first reflector and the second reflector may comprise a lightweight material. In some embodiments, at least of reflector may comprise carbon composite. Hence, the weight of the test system may be reduced such that transport of the system is easier.

A signal path of the outgoing test signals and the incoming test signals between the DUT and the second reflector may be parallel to a bottom of the shielded chamber. Accordingly, some portions of the signal path may rather be mainly arranged in the vertical direction while others may be mainly arranged in a horizontal direction. This may lead to a very compact design of the overall test system.

The shielded chamber may be portable. In some embodiments, the shielded chamber may comprise wheels provided at the bottom of the shielded chamber. Additionally, the test chamber and/or the antenna chamber may comprise wheels as well. Accordingly, the test system may particularly be configured for transport measures.

Accordingly, the shielded chamber, the test chamber and/or the antenna chamber may be portable or removable with respect to the other chambers. Hence, a modular test system is provided, as the individual chambers can be connected with each other, namely via the interfaces.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 is a schematic drawing of a test system according to an embodiment of the present disclosure.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

All of the features disclosed hereinafter with respect to the example embodiments and/or the accompanying FIGURES can alone or in any sub-combination be combined with features of the aspects of the present disclosure including features of example embodiments thereof, provided the resulting feature combination is reasonable to a person skilled in the art.

FIG. 1 is a schematic drawing of a test system 10 according to an embodiment. The test system 10 comprises a shielded chamber 12 (main chamber), a test chamber 14, and an antenna chamber 16. In the shown embodiment, these chambers 12, 14, 16 are separately formed.

The shielded chamber 12 comprises a first interface 18 associated with the test chamber 14. The first interface 18 is located such that components arranged inside an interior volume defined by the shielded chamber 12 may (electromagnetically) interact with components arranged inside an interior volume defined by the test chamber 14 and vice versa.

The shielded chamber 12 also comprises a second interface 20 associated with the antenna chamber 16. Accordingly, the second interface 20 is located such that components arranged inside an interior volume defined by the shielded chamber 12 may (electromagnetically) interact with components arranged inside an interior volume defined by the antenna chamber 16.

The first interface 18 and/or the second interface 20 may comprise an opening or a window such that electromagnetic waves may pass substantially undisturbed the respective interface.

Hence, the electromagnetic interaction may be understood as an interaction without any additional attenuation compared to the one due to the over-the-air testing.

The test chamber 14 and the first interface 18 are substantially perpendicular arranged relative to the antenna chamber 16 and the second interface 20, for example from the viewpoint of the shielded chamber 12 assuming a Cartesian coordinate system.

The test system 10 further comprises a feed antenna 22 that is arranged inside the antenna chamber 16. The feed antenna 22 is configured for emitting and receiving electromagnetic signals for testing a device under test (DUT) 29 located in the test chamber 14.

A first reflector 24, also called sub-reflector, and a second reflector 26, also called main reflector, are arranged inside the shielded chamber 12. The first reflector 24 may have a hyperboloid or an ellipsoid shape and, therefore, the first reflector 24 may have two focal points. In contrast thereto, the second reflector 26 may have a paraboloid shape with a single focal point.

In the shown embodiment, the first reflector 24 is located near the bottom 25 of the shielded chamber 12. In an alternative, the first reflector 24 may also rest on the bottom 25 of the shielded chamber 12. The height H2 of the shielded chamber 12 and the height H1 of the test system 10 may therefore be reduced. In a further alternative, the first reflector 24 is located near the ceiling of the shielded chamber 12 or mounted at the ceiling, which will be discussed later in more detail. In any case, the DUT 29 is located within a quiet zone 28 established inside the test chamber 14.

The feed antenna 22, the first reflector 24, the second reflector 26, and the DUT 29 are arranged such that a signal path 30 for electromagnetic waves is established between the feed antenna 22 via the first and second reflectors 24, 26 and the DUT 29. In view of the shape of the second reflector 26 the electromagnetic waves are plane waves 32 at a test location of the DUT 29, namely the location where the DUT 29 is positioned. In some embodiments, plane waves 32 are already obtained between the second reflector 26 and the DUT 29. The plane waves 32 run parallel to the bottom 25 of the shielded chamber 12.

In the shown embodiment, a phase center 34 of the feed antenna 22 is located on top of a center 36 of the first reflector 24, for example on top of the shielded chamber 12. In other words, in a vertical direction along the height H1 of the test system 10 the phase center 34 is located above the center 36 of the first reflector 24. Therefore, the test system 10 is configured according to an inverted test arrangement.

The center 36 of the first reflector 24 is positioned at a distance greater than a minimum distance away from the phase center 34 of the feed antenna 22. The minimum distance depends on the focal points of the first reflector 24 such that the electromagnetic signals may be guided from the first reflector 24 towards the feed antenna 22 without significant losses.

The test system 10 may comprise an alignment member 38. According to this embodiment, the alignment member 38 comprises several spring locks such that the test chamber 14 may be detachably connected to the shielded chamber 12. The alignment member 38 may, for example, be configured for defining a pre-determined position of the test chamber 14 relative to the shielded chamber 12.

Although not shown, the test system 10 may also comprise an antenna positioner adapted and configured such that the antenna chamber 16 may be detachably connected to the shielded chamber 12 according to a pre-defined position.

Furthermore, the test system 10 comprises transportation means for enabling easy transport of the chambers 12, 14, 16. In this embodiment, these transportation means comprise multiple wheels 40 located at a bottom of the shielded chamber 12 and the test chamber 14. Although not shown, the antenna chamber 16 may also comprise wheels for easy transport, for example at its side facing away from the shielded chamber 12 in the installed setup shown in FIG. 1.

The test system 10 also comprises an additional positioner 42 having an articulated arm for positioning the DUT 29 inside the quite zone 28 established in the test chamber 14.

The test system 10 has an overall height H1 and an overall length L1. The shielded chamber 12 may have a height H2 and a length L2. Due to the constraints regarding the arrangement and size of the first reflector 24 and the second reflector 26, the shielded chamber 12 may be the chamber having largest dimensions presuming a Cartesian coordinate system. Since the test chamber 14 and the antenna chamber 16 are detachably connected to the shielded chamber 12, the test system 10 is configured for easy transport. During transport actions the dimensions of the test system 10 are reduced since the shielded chamber 12 has significantly smaller dimensions L2, H2 within a Cartesian coordinate system. Hence, the individual chambers of the test system 10 may better fit spatial bottlenecks such as doors or elevators.

The particular configuration for easy transport is further strengthened by the wheels 40.

In an alternative embodiment, the second interface 20 is associated with the bottom of the shielded chamber 12 such that the antenna chamber 16 is detachably connected with the bottom of the shielded chamber 12. Hence, the first reflector 24 that directly interacts with the feed antenna 22 is located near the ceiling or rather mounted to the ceiling of the shielded chamber 12.

Electromagnetic waves emitted by the feed antenna 22 propagate in a vertical direction, e.g. along the axis defining the height of the test system 10, towards the ceiling of the shielded chamber 12 while being reflected by the first reflector 24 towards the second reflector 26. The second reflector 26 reflects the electromagnetic waves such that they further propagate in a perpendicular direction towards the first interface 18, the DUT 29 and the quiet zone 28, namely in horizontal direction.

Generally, the antenna chamber 16 is a closed chamber having only one open side that interfaces with the second interface 20 located at the bottom or the ceiling of the shielded chamber 12. The open side may comprise a window or an opening. The window may be established by an electromagnetically penetrable material, namely a material permitting electromagnetic waves to go through without (substantial) attenuation.

The test system 10 may further comprise control and/or measurement equipment that is used to control the feed antenna 22, the device under test 29 and/or the positioner 42. The control and/or measurement equipment may comprise one or more circuits configured to (e.g., programmed to) at least control the feed antenna 22, the device under test 29 and/or the positioner 42, as well as carrying out any other function described herein.

In addition, reflector positioners may be provided that can be controlled appropriately to set the reflectors 24, 26 into desired orientations and/or positions. These reflector positioners may also be controlled by the control and/or measurement equipment.

The control and/or measurement equipment is further used for obtaining measurements of the feed antenna 22 or the device under test 29 while analyzing and evaluating the measurements in order to gather measurement results.

The inverted setup shown corresponds to establishing a first signal path portion between the feed antenna 22 and the first reflector 24, wherein the first signal path portion is (substantially) parallel to the side of the shielded chamber 12 at which the first interface 18 is provided that is used for enabling the (electromagnetic) interaction with the DUT 29. In other words, both signal path portions of the overall signal path 30 intersect each other in a (substantially) perpendicular manner.

Certain embodiments, devices, etc., disclosed herein, such as, for example, the control and/or measurement equipment utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test system for testing a device under test, the test system comprising at least one feed antenna, a shielded chamber, and at least a first reflector and a second reflector,
   wherein the test system is a compact antenna test range,
   wherein the first reflector and the second reflector are arranged inside the shielded chamber,
   wherein the first reflector is configured and arranged such that it redirects outgoing test signals emitted by the at least one feed antenna towards the second reflector and incoming test signals coming from the second reflector towards the at least one feed antenna,
   wherein the device under test is arranged outside the shielded chamber encompassing the first reflector and the second reflector, wherein the shielded chamber comprises at least a first interface associated with the device under test, wherein the first interface and the feed antenna are located at different sides of the shielded chamber, which are perpendicular to each other.

2. The test system of claim 1, wherein the device under test is arranged in a separately formed test chamber that is adjacently arranged to the shielded chamber.

3. The test system of claim 1, wherein the device under test is arranged in an at least partly open space adjacent to the shielded chamber.

4. The test system according to claim 1, further comprising a positioner for positioning the device under test.

5. The test system according to claim 1, wherein a phase center of the at least one feed antenna is located on top of the shielded chamber, and wherein the phase center is higher than the center of the first reflector.

6. The test system according to claim 1, wherein the first reflector is positioned close to a bottom of the shielded chamber or rests on the bottom of the shielded chamber.

7. The test system according to claim 1, wherein a phase center of the at least one feed antenna is located below the shielded chamber, and wherein the phase center is lower than the center of the first reflector.

8. The test system according to claim 1, wherein the feed antenna is located in an antenna chamber adjacently arranged to the shielded chamber.

9. The test system according to claim 1, wherein the first interface of the shielded chamber comprises an opening or a window.

10. The test system according to claim 1, wherein the first reflector is a sub-reflector having two focal points.

11. The test system according to claim 1, wherein the first reflector has a shape of one of a hyperboloid or an ellipsoid.

12. The test system according to claim 1, wherein the second reflector is a main reflector having a shape of a paraboloid.

13. The test system according to claim 1, wherein at least one of the first reflector and the second reflector comprises a lightweight material.

14. The test system according to claim 1, wherein a signal path of the outgoing test signals and the incoming test signals between the device under test and the second reflector is parallel to a bottom of the shielded chamber.

15. The test system according to claim 1, wherein the shielded chamber is portable.

* * * * *